United States Patent
M et al.

(10) Patent No.: US 8,650,010 B2
(45) Date of Patent: Feb. 11, 2014

(54) APPARATUS AND METHOD FOR GENERATING A TEST SIGNAL WITH EMULATED CROSSTALK

(75) Inventors: Parthasarathy Raju M, Bangalore (IN);
Sampathkumar R. Desai, Bangalore (IN); John J. Pickerd, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 503 days.

(21) Appl. No.: 12/958,207

(22) Filed: Dec. 1, 2010

(65) Prior Publication Data
US 2012/0109568 A1 May 3, 2012

(30) Foreign Application Priority Data
Nov. 2, 2010 (IN) .......................... 3044/MUM/2010

(51) Int. Cl.
*G06F 17/50* (2006.01)

(52) U.S. Cl.
USPC .................. 703/2; 703/13; 703/18; 716/115; 379/406.08; 379/406.1; 324/601; 370/201; 370/286; 702/124

(58) Field of Classification Search
USPC ............... 703/2, 13, 18; 716/6, 115; 370/201, 370/286; 702/124; 324/601
See application file for complete search history.

(56) References Cited

U.S. PATENT DOCUMENTS

| | | | |
|---|---|---|---|
| 4,688,245 A * | 8/1987 | Schenk .................... | 379/406.08 |
| 7,075,312 B2 * | 7/2006 | Fabry et al. ................... | 324/601 |
| 7,741,857 B2 * | 6/2010 | Jagannathan et al. ......... | 324/638 |
| 7,777,497 B2 * | 8/2010 | Albert-Lebrun et al. ..... | 324/601 |
| 2007/0064923 A1 * | 3/2007 | Schmukler et al. ......... | 379/406.1 |
| 2007/0275607 A1 * | 11/2007 | Kwark et al. ................. | 439/676 |

* cited by examiner

*Primary Examiner* — Thai Phan
(74) *Attorney, Agent, or Firm* — William K. Bucher; Marger, Johnson & McCollom, P.C.

(57) ABSTRACT

A signal generator produces a victim signal having crosstalk emulation by filtering and combining a victim signal waveform record file and an aggressor signal waveform record file generated using parameters selected by a user. A signal channel or a cascaded signal channel is characterized using one or more S-parameter arrays. The S-parameter array or arrays represent a mixed-mode multiple-port device under test. Coefficients of a NEXT filter, a FEXT filter and a forward transmission filter are derived from selected S-parameters of the S-parameter array. The aggressor signal is filtered individually by the NEXT and FEXT filters. The victim signal is summed with the filtered aggressor signal from the NEXT filter with the resulting summed signal being filtered by the forward transmission filter. The filtered signal from the forward transmission filter is summed with the filtered aggressor signal from the FEXT filter to generate a victim signal having crosstalk emulation.

16 Claims, 11 Drawing Sheets

Figure 6

| | 120 | | | 122 |
|---|---|---|---|---|

Base Pattern | Transmitter | Channel/Cable

124 — Periodic Jitter (Pk-Pk)
- 130: Magnitude
- 132: (units)
- 134: Frequency (Hz)
- 136: Phase (°)

| | Magnitude | | Frequency (Hz) | Phase (°) |
|---|---|---|---|---|
| ☑ Sine1: | 0.981 | UI | 20.000000 M | 0.00 |
| ☐ Sine3: | 0.00 | UI | 10.000000 M | 0.00 |
| ☐ Sine4: | 0.00 | UI | 10.000000 M | 0.00 |
| ☐ Sine4: | 0.00 | UI | 10.000000 M | 0.00 |

126 — Random Jitter (RMS)

139 — ☐ Random Seed: 12345  — 140
137 — ☐ Rj1 Crest Factor (Peak): 12,732  X Sigma  — 138

141 — Magnitude: 142 — Frequency-Low (Hz): 143 — Frequency-High (Hz): 144

| | Magnitude | | Frequency-Low (Hz) | Frequency-High (Hz) |
|---|---|---|---|---|
| ☑ Rj1: | 0.0080 | UI | 100.000 k | 1.350000000 G |
| ☐ Rj2: | 0.0000 | UI | 100.000 k | 1.350000000 G |
| ☐ Rj3: | 0.0000 | UI | 100.000 k | 1.350000000 G |

145 — ☐ SSC

128 — Shape: Triangle     [Browse...]
146 — 152 — 151
Spread: Down    Unequal Spread: 0.00 %
148 — 150

153 — df/dt
- Minimum Duration: 0.00 us   df/dt: 0.000 ppm/μs
- Location: 50 %

154 — Frequency
- Deviation: 155 — 4000.000 ppm   Modulation: 33.000 k Hz — 156

157 — ☐ Noise:  158 — 0.000 Volt (RMS)   Add Noise At: Near End — 160

162 — ☐ Pre/De-emphasis: 0.000 dB   [☐ Advanced Setup...]
                          164   166            168

Figure 6

$S_{dd21}$: NEXT (TRANSMISSION COEFFICIENT FROM PORT 1 TO PORT 2)

$S_{dd41}$: FEXT (TRANSMISSION COEFFICIENT FROM PORT 1 TO PORT 4)

$S_{dd42}$: FORWARD TRANSMISSION COEFFICIENT FROM PORT 2 TO PORT 4

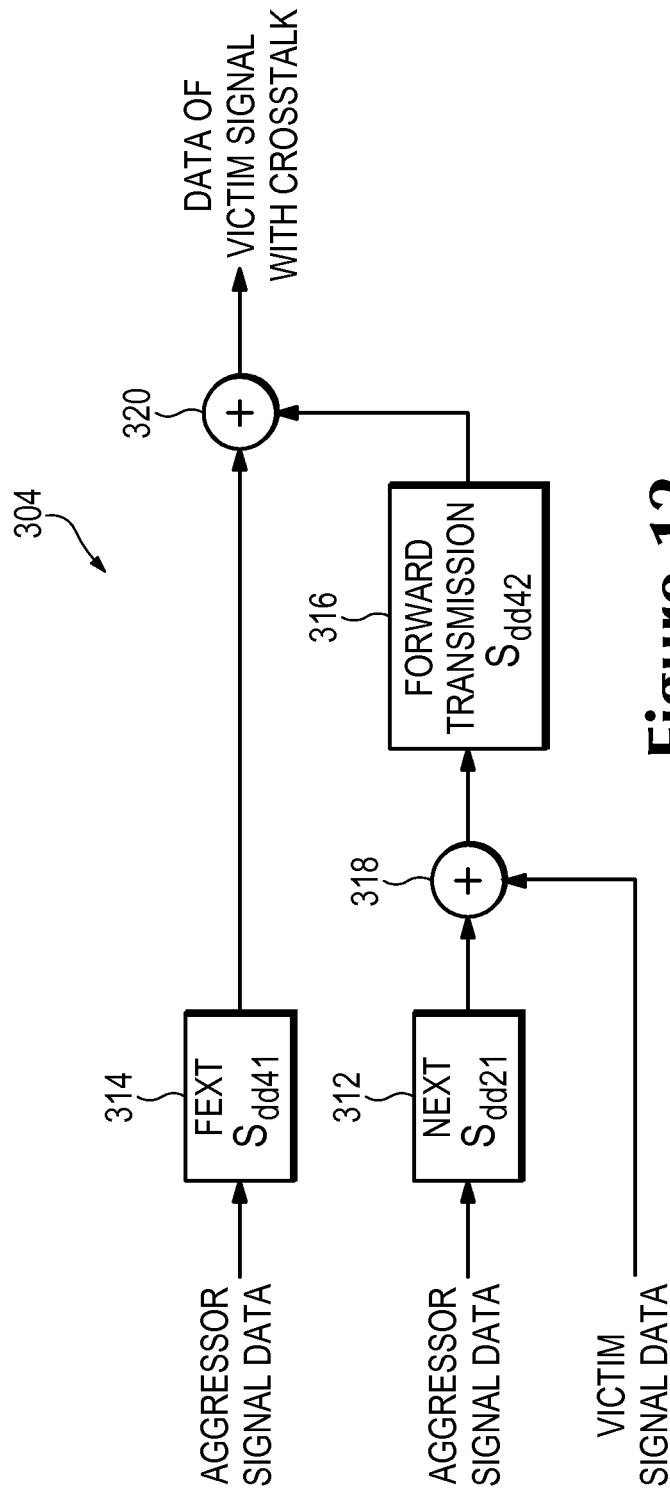

APPARATUS AND METHOD FOR GENERATING A TEST SIGNAL WITH EMULATED CROSSTALK

BACKGROUND OF THE INVENTION

The present invention relates generally to a signal generator generating test signals and more particularly to a signal generator generating a test signal having emulated crosstalk.

In high speed digital signaling standards, such as PCI-Express, DisplayPort and the like, individual components of a signal channel, such as connectors, cables, circuit board traces and the like, can be represented by S-parameters (scattering parameters). These components can cause impairments in the signal transported across the channel, such as intersymbol interference, noise, crosstalk and the like, that are not desirable. The above standards adopt differential signaling for reducing these impairments.

Crosstalk is caused by capacitive and/or inductive coupling into one signal channel by a signal or signals on an adjacent signal channel or channels. The signal and signal channel being affected by the crosstalk are respectively referred to as the victim signal and victim signal path and the adjacent signal or signals on the adjacent signal channel or channels are respectively referred to as the aggressor signal or signals and aggressor signal path or paths. The crosstalk dominantly affects the victim signal both at the near and far ends of the signal path.

High speed serial data designers are required to design robust and reliable receivers to meet the required bit error rate for specified conditions. Crosstalk from neighboring paths has an adverse effect on the performance of high speed serial data. A designer needs to ascertain the effect of crosstalk, which is dictated by the physical property of signal paths coupled to the receiver, such as the PCB (print circuit board) traces, cables, connectors and the like, and also the characteristic of aggressor and victim signals.

FIG. 1 shows a conventional test setup 10 for measuring the compliance of a DisplayPort communication system to an applied victim signal having crosstalk generated using aggressor signal. A signal generator 12, such as an AWG7122B manufactured and sold by Tektronix, Inc., Beaverton, Oreg., generates a victim signal and aggressor signals that are provided to a DisplayPort device under test (DUT) 14, such as a transmitter/receiver circuit. The victim signal and the aggressor signals are provided to a test fixture 16, such as an ET-DP-TRA-P Plug Fixture, such as manufactured and sold by Efficere Technologies, Vancouver, Wash., via Transition Time Converter (TTC) modules 18. The TTC modules 18 slow the rise time of the differential victim and aggressor signal, to be in compliance with the DisplayPort compliance testing standard. The victim signal and the aggressor signals are provided to the receiver inputs of the DUT 14 via the test fixture 16. The transmitter outputs of the DUT 14 are coupled via the test fixture 16 to a DisplayPort AUX Control 20 that receives the differential transmitter output, coverts the differential signal to a single ended signal and conditions the signal for use by a test and measurement instrument 22, such as an oscilloscope. The DisplayPort AUX Control 20 couples the single ended transmitter signal to an acquisition channel input of the oscilloscope, such as a DPO70254 Digital Oscilloscope, manufactured and sold by Tektronix, Inc., Beaverton, Oreg.

The DisplayPort set-up has four channels shown as Lane 0, Lane 1, Lane 2 and AUX channel. In Receiver Stress Testing, a Test Lane (e.g. Lane 1) is fed with a test signal (victim signal) in the form of a stressed pattern having various signal impairments, such as deterministic and random jitter, noise and the like, from a signal generator 12, such as the AWG7122B manufactured and sold by Tektronix, Inc., Beaverton, Oreg. The signal generator 12 also feeds aggressor signals to the neighboring lanes (Lanes 0, Lane 2) in the form of a half clock pattern or the like, which inflict crosstalk onto the Test Lane. The DisplayPort Standard provides the specification for both the victim signal and the aggressor signal. The layout of the test fixture 16 produces crosstalk on the victim signal on Lane 1 in response to the aggressor signals on Lanes 0 and Lanes 2. The victim signal is coupled to the DUT 14 via the TTC modules 18, associated cabling and the test fixture 16. The stressed test signal with crosstalk is processed by the receiver circuitry in the DUT 14 and coupled to the transmitter circuitry in the DUT 14, which processes the received signal and outputs a transmitter signal via the auxiliary channel to the DisplayPort AUX Control 20. The DisplayPort AUX Control 20 converts the transmitter differential signal to a single ended signal and conditions the signal for use by serial trigger circuitry in the oscilloscope 22. The oscilloscope receives the output signal from the DisplayPort AUX Control 20, digitizes and processes the incoming signal and displays the resultant signal data on a display device for analysis.

The process of setting up for a DisplayPort receiver stress test is cumbersome, time consuming and prone to errors. In addition, the set-up does not allow flexibility for the designer to modify the channel and signal parameters. Further, costs may occur as revisions and improvements of the standard are implemented requiring new cabling, fixtures, and the like. The physical properties of the custom made fixtures determine the influence of crosstalk on the victim signal. It could be much different from the actual hardware signal channels designed for the DUT 14. Therefore, it is important for a designer to test the transmitter/receiver design with crosstalk generated by the actual hardware signal channels.

SUMMARY OF THE INVENTION

The present invention is directed to a signal generator having a display and a central processing unit generating a user interface on the display for setting parameters for a victim signal and an aggressor signal. A waveform record file of the victim signal is generated using the victim signal parameters and a waveform record file of the aggressor signal is generated using the aggressor signal parameters. An S-parameter conversion circuit receives at least a first S-parameter array representative of characteristics of a multi-port signal channel and generating filter coefficients for each of a first filter representing near end crosstalk, a second filter representing far end crosstalk and a third filter representing a transfer characteristic between a first port and a second port. A crosstalk emulation circuit receives the waveform record of the victim signal, the waveform record of the aggressor signal and the filter coefficients for each of r the first, second and third filters and generates a waveform record file representative of the victim signal with emulated crosstalk effects. The waveform record file of the aggressor signal is separately filtered by the first filter and the second filter. The filtered waveform record file using the first filter is summed with the waveform record file of the victim signal and the resultant summed waveform record file is filtered by the third filter and summed with the filtered waveform record using the second filter to generate a waveform record file of the victim signal with emulated crosstalk effects. A waveform generation circuit receives the waveform record file of the victim signal with emulated crosstalk effects and generates an analog output signal representative of the victim signal with emulated crosstalk effects.

The parameters for the victim signal may include deterministic jitter impairments and random jitter impairments with the deterministic jitter impairments selected from a group of parameters for intersymbol interference impairments, duty cycle distortion impairments, sinusoidal jitter impairments and spread spectrum clock impairments.

The S-parameter array may represent a single-ended multi-port signal channel or a differential mixed-mode multi-port signal channel. The differential mixed-mode multiple-port signal channel is modeled having a first differential input port receiving the aggressor signal, a second differential input port receiving the victim signal, a first differential output port receiving the transmitted aggressor signal and a second differential output port receiving the transmitted victim signal. The transmission S-parameter of the S-parameter array from the first input port to the second input port represents the characteristics of the first filter, the transmission S-parameter of the S-parameter array from the first input port to the second output port represents the characteristics of the second filter, and the transmission S-parameter of the S-parameter array from the second input port to the second output port represents the characteristic of the third filter.

The first filter coefficients, the second filter coefficients, and the third filter coefficients are respective impulse response time domain data respectively derived from the transmission S-parameter of the S-parameter array from the first input port to the second input port representing characteristics of the first filter, the transmission S-parameter of the S-parameter array from the first input port to the second output port representing characteristics of the second filter, and the transmission S-parameter of the S-parameter array from the second input port to the second output port representing, characteristic of the third filter.

The multiple-port signal channel may have a plurality of components with each component having an S-parameter array characterizing the component. The plurality of S-parameter arrays characterizing the plurality of components are combined to generate an S-parameter array characterizing multiple-port signal channel.

A corresponding method for generating a victim signal having emulated crosstalk has the steps of generating a victim signal waveform record file from victim signal parameters and an aggressor signal waveform record file from aggressor signal parameters. An S-parameter array is provided having S-parameters representing the characteristics of a signal channel. First, second and third filter coefficients are generated for respective first, second and third filters from respective a first S-parameter, a second S-parameter and a third S-parameter of the S-parameter array. The aggressor waveform record file is separately filtering using the respective filter coefficients of the first filter representing near end crosstalk and the second filter representing far end crosstalk. The filtered waveform record file from the first filter is summed with the waveform record file of the victim signal with the resultant summed waveform record file being filtered using the third filter. The filtered waveform record using the third filter is summed with the filtered aggressor waveform record from the second filter to generate a waveform record file of the victim signal with emulated crosstalk effects. An analog victim signal having emulated crosstalk effects is generated from the waveform record file of the victim signal with emulated crosstalk effects The S-parameters array providing step has the additional step of providing a plurality of S-parameter arrays having S-parameters representing characteristics of a plurality of components of the signal channel. Providing the plurality of S-Parameter arrays has the additional step of combining the plurality of S-parameter arrays representing characteristics of the plurality of components of the signal channel into an S-parameter array having S-parameters representing the characteristics of the signal channel. The S-parameter array providing step has a further step of generating an S-parameter array having S-parameters representing a differential mixed-mode multiple-port device under test having a first differential input port receiving the aggressor signal, a second differential input port receiving the victim signal, a first differential output port receiving the transmitted aggressor signal and a second differential output port receiving the transmitted victim signal.

The S-parameters of the S-parameter array from the first input port to the second input port represent characteristics of the first filter, the S-parameter of the S-parameter array from the first input port to the second output port represent characteristics of the second filter, and the S-parameter of the S-parameter array from the second input port to the second output port represent characteristic of the third filter. The generating of the first filter coefficients, the second filter coefficients, and third filter coefficients has the step of generating impulse response time domain data for each of the first, second, and third filters respectively derived from the S-parameter of the S-parameter array from the first input port to the second input port representing characteristics of the first filter, the S-parameter of the S-parameter array from the first input port to the second output port representing characteristics of the second filter, and the S-parameter of the S-parameter array from the second input port to the second output port representing characteristic of the third filter.

The objects, advantages and novel features of the present invention are apparent from the following detailed description when read in conjunction with appended claims and attached drawings.

BRIEF DESCRIPTION OF THE DRAWINGS

FIG. 6 is a representation of a TRANSMITTER pop-up window for setting impairments on a victim test signal in a signal generator for generating a test signal with emulated crosstalk according to the present invention.

FIG. 12 is a representative block diagram illustrating the generation of a victim test signal having crosstalk emulation according to the present invention.

DETAILED DESCRIPTION OF THE INVENTION

Figure 2:
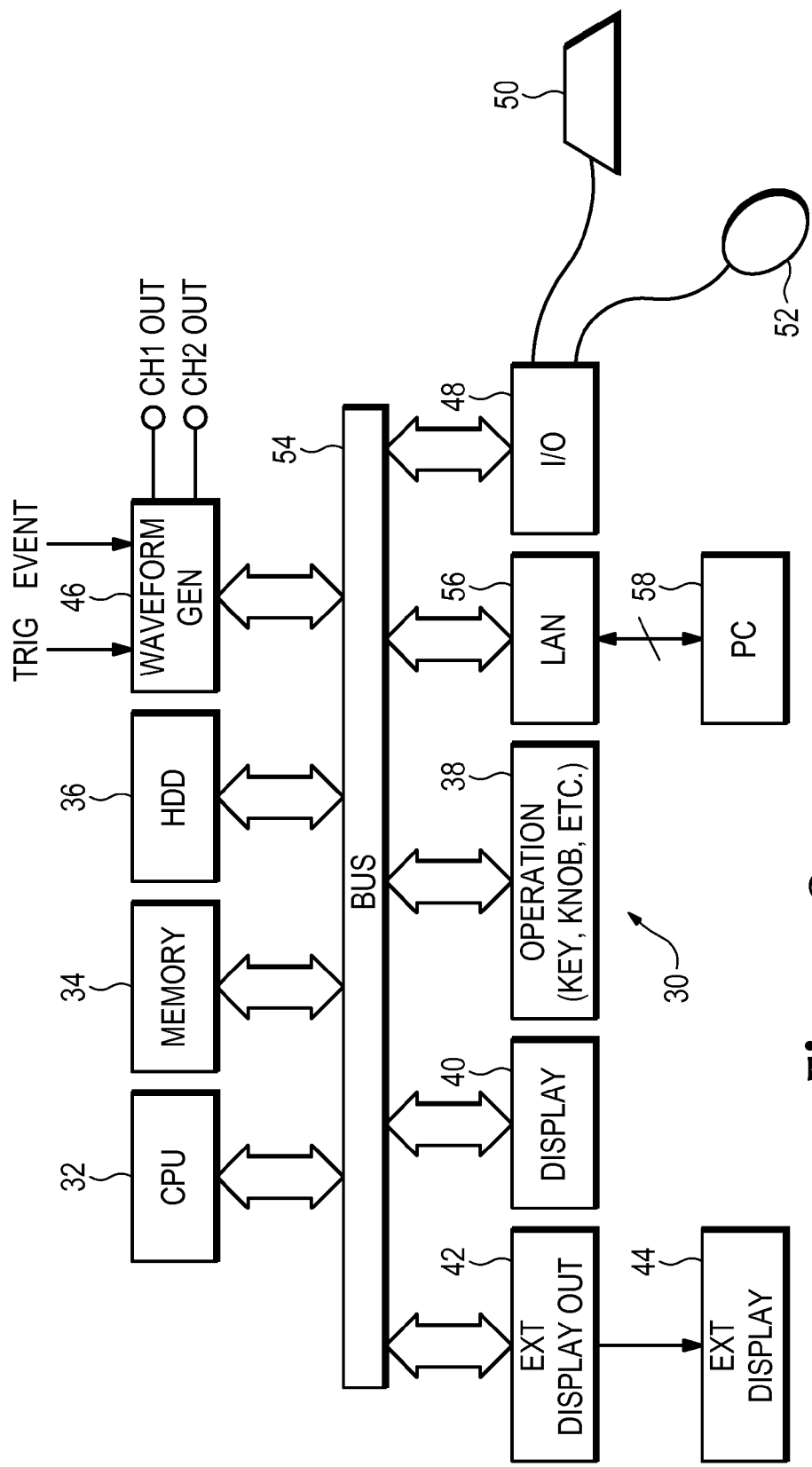
FIG. 2 is a functional block diagram of an exemplary embodiment of a signal generator for generating a test signal with emulated crosstalk according to the present invention.

Referring to FIG. 2, there is shown a representative block diagram of a signal generator 30, such as the AWG7122B manufactured and sold by Tektronix, Inc., Beaverton, Oreg., for generating a test signal with emulated crosstalk according to the present invention. The signal generator 30 has a central processing unit (CPU) 32 that controls the operation of the instrument according to programs stored on electronic media, such as a Compact Disc (CD) or on storage device 36. A memory 34, such as RAM memory, is used for a work area for the CPU 32 to read programs from the storage device 36, such as a hard disk drive. A user can set up the signal generator 30 to generate an output test signal via the buttons, knobs and the like on a front panel 38 of the instrument. A display device 40 displays a user interface for setting various parameters for the output test signal and visualizing an output signal as a function of the parameter settings. An external display output circuit 42 provides a video output which may be connected to an external display 44 for providing a larger display area in addition to the built-in display 40 of the signal generator. A waveform generation circuit 46 generates the output test signal based on user defined parameters. In this example, the waveform generation circuit 46 has a trigger input and an event input and two channel outputs with each output channel capable of generating differential signals. An input/output port 48 is used for connecting an external keyboard 50, a pointing device, such as a mouse 52, and the like to the signal generator. The external keyboard 50 and/or mouse 52 may be included as part of the front panel controls of the signal generator 30 for setting parameters. The blocks are coupled together via a signal and data bus 54. The bus 54 of the signal generator 30 may have a Local Area Network (LAN) interface 56 for connecting the signal generator 30 to an external controller, such as a personal computer (PC) 58 or other testing instruments. The LAN interface 56 allows the user interface to operate on the PC 58 and pass output signal data to the signal generator 30 and also enables the PC 58 to control the signal generator 30 over a network. Alternatively, a General Purpose Interface Bus (GPIB) interface may be used for the LAN interface 56.

Figure 1:
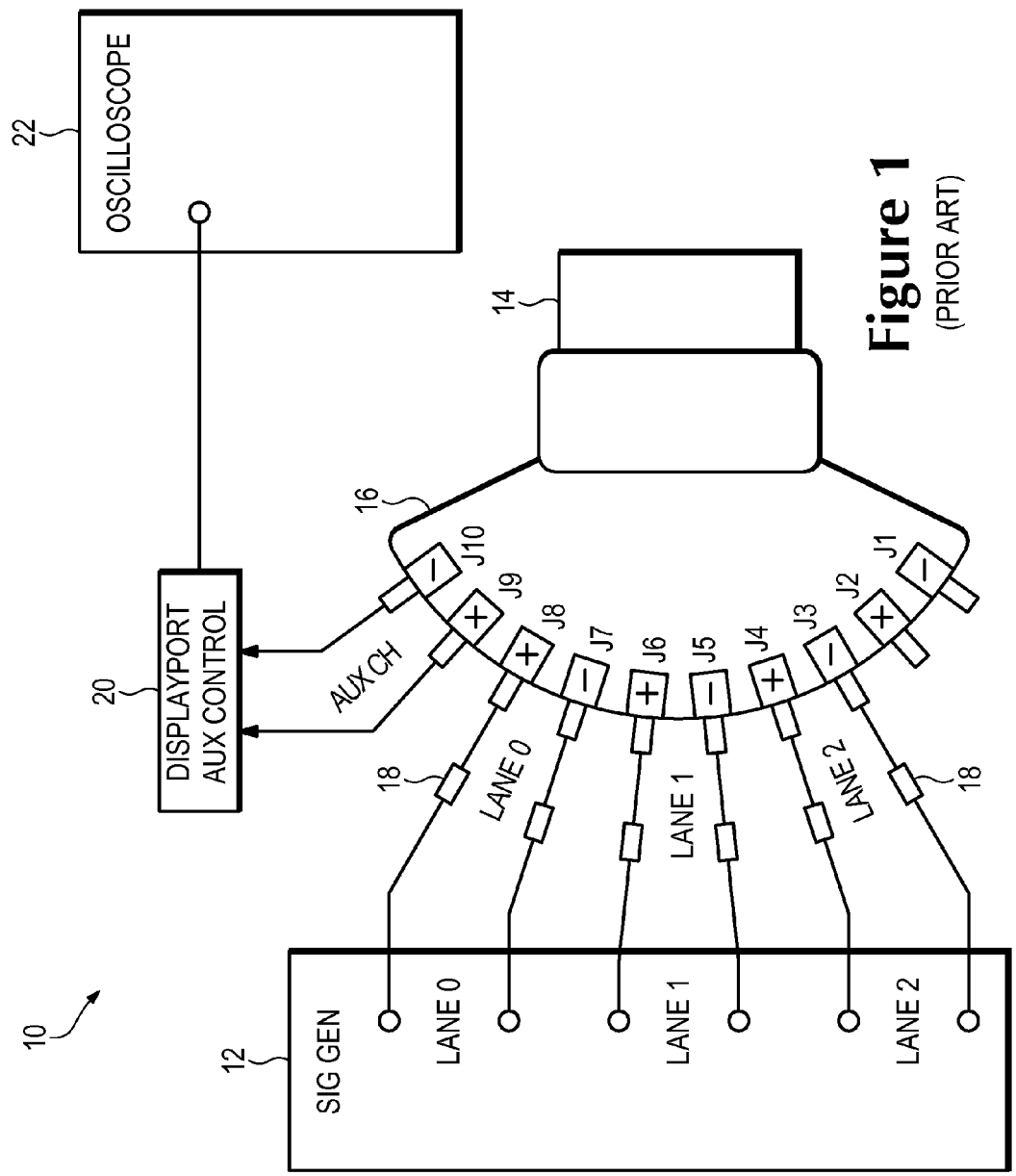
FIG. 1 is a conventional test setup for measuring a differential victim test signal with crosstalk.
Figure 3:
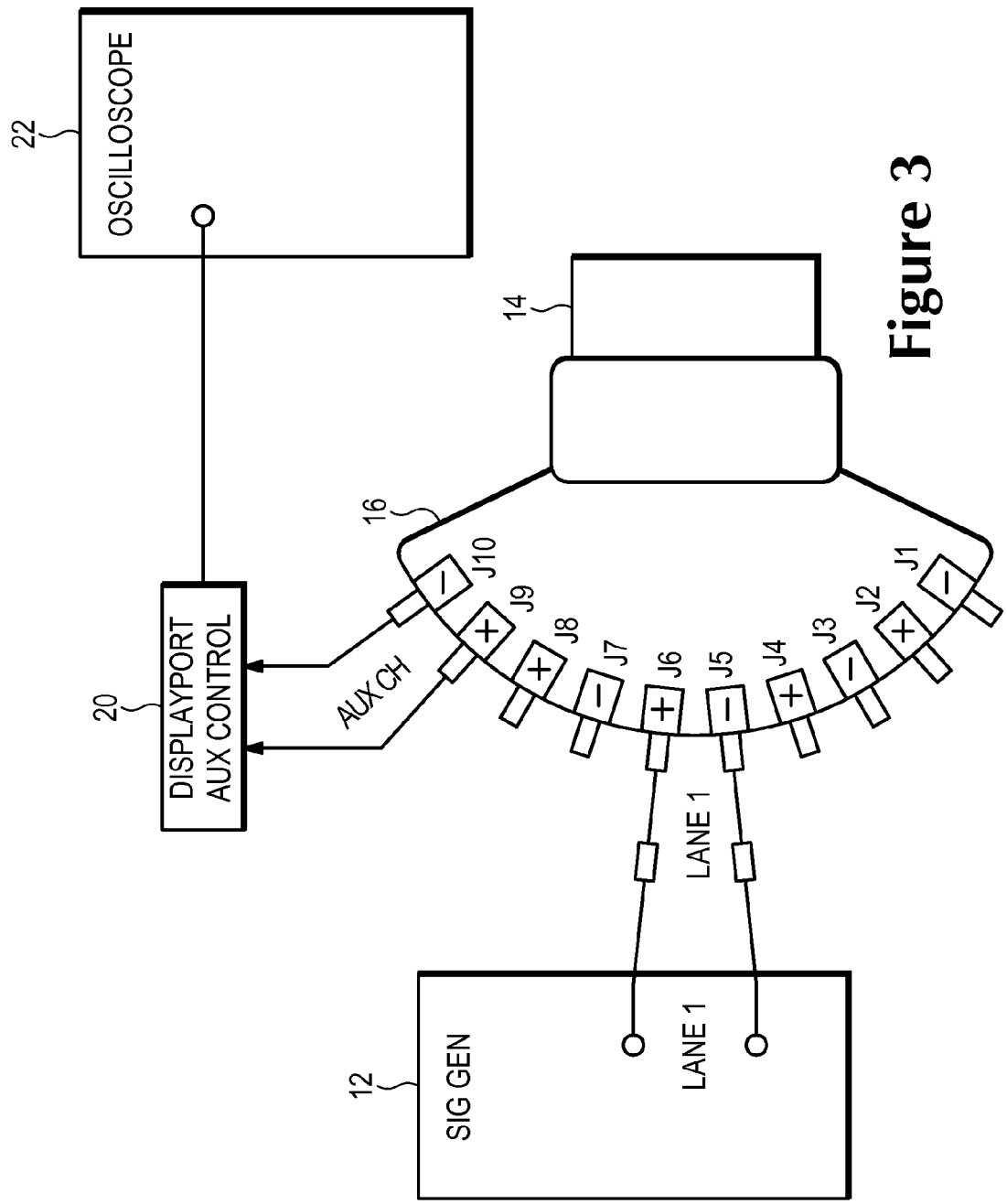
FIG. 3 is a test setup for measuring a differential victim test having crosstalk emulation according to the present invention.

FIG. 3 shows a test setup for measuring the compliance of a DisplayPort communication system to an applied victim signal having emulated crosstalk. The emulated crosstalk on the victim signal represents the electrical effects of various components of a signal channel coupling the victim signal from a transmitter to a receiver. The various components of the signal channel may include PCB (printed circuit board) traces, cables, connectors and the like. The magnitude and phase over a frequency range for each of the components of the signal channel may be characterized using S-parameters with the S-parameters of individual components being combined to characterize the total signal channel. Like elements from FIG. 1 are labeled the same in FIG. 3. The signal generator 12, such as shown in the block diagram of FIG. 2, generates a victim signal using the invention for generating a test signal having emulated crosstalk. The victim signal with emulated crosstalk is coupled to the DUT 14 via the TTC modules 18, associated cabling and test fixture 16. The stressed test signal with crosstalk is processed by the receiver circuitry in the DUT 14 and coupled to the transmitter circuitry in the DUT 14, which processes the received signal and outputs a transmitter signal via the auxiliary channel to the DisplayPort AUX Control 20. The DisplayPort AUX Control 20 converts the transmitter differential signal to a single ended signal and conditions the signal for use by serial trigger circuitry in the oscilloscope 22. The oscilloscope receives the output signal from the DisplayPort AUX Control 20, digitizes and processes the incoming signal and displays the resultant signal data on a display device for analysis.

The present invention will be described with respect to the signal generator 30 operating under program control of the CPU 32 that generates a test signal having emulated crosstalk. A user interface and associated pop-up windows are provided that allows a user to input parameters for generating the test signal. The user interface and signal generation programs are stored on the storage device 36. The user interfaces may be displayed on the display device 40 or on the external display 44. Alternately, the user interface programs may be stored and accessed by the PC 58 with the PC 58 processing the parameters and generating an output waveform record file containing digital data values representing the victim signal with emulated cross talk. The output waveform record file is coupled to and stored in the signal generator 30.

Figure 4:
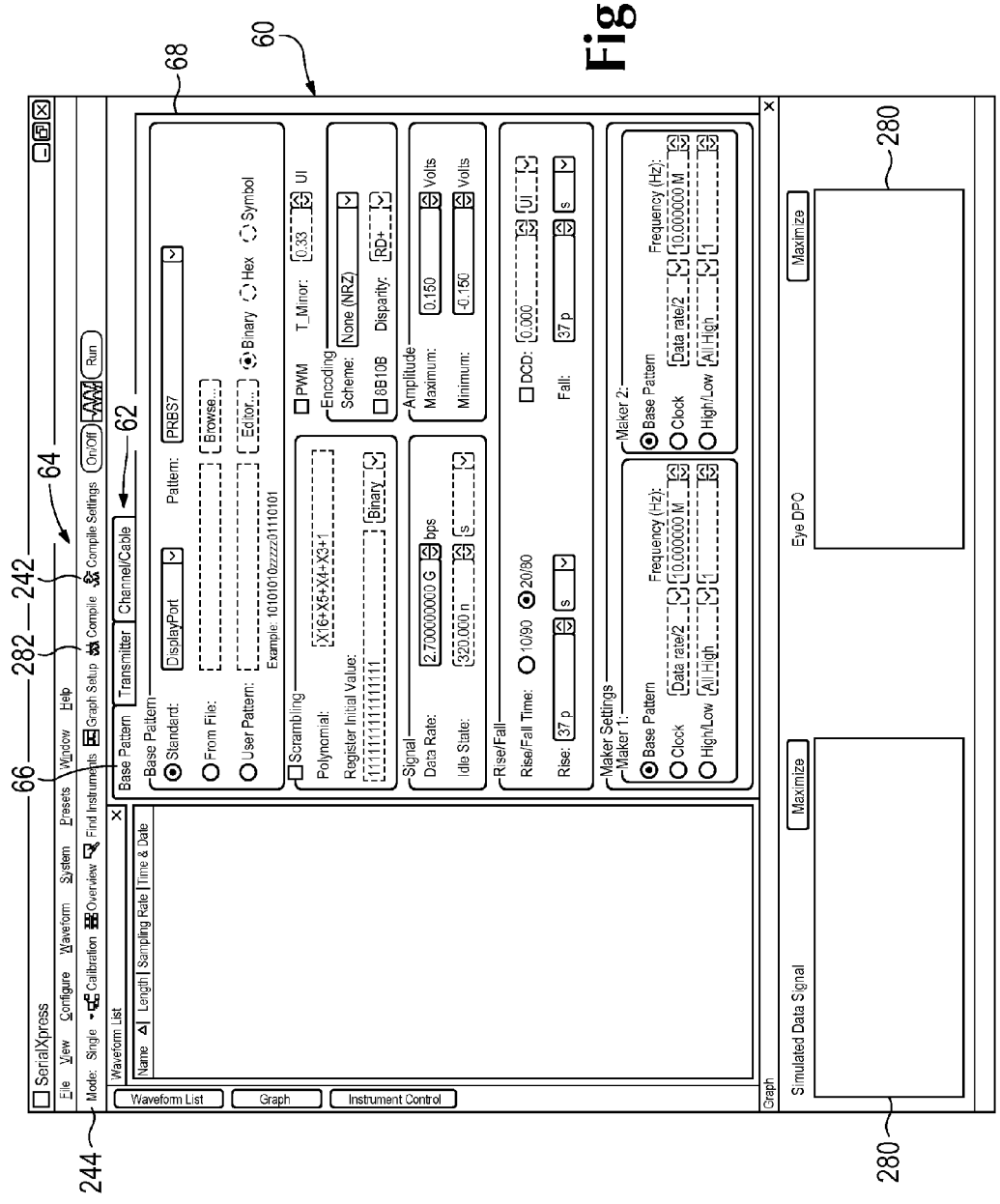
FIG. 4 is an initial user interface for a signal generator for generating a test signal with emulated crosstalk according to the present invention.

Referring to FIG. 4, there is shown an initial user interface 60 for setting parameters for a victim signal and aggressor signals for generating a test signal having crosstalk emulation. The programs controlling the various interfaces on the signal generator 30 may be accessed via an icon on the display device 40 or by clicking on a start tab and clicking the appropriate program from a list of programs stored in the signal generator 30. The initial user interface 60 includes a number of pop-up windows that are activated by clicking on various tabs 62 or buttons 64 in the initial user interface 60. The initial user interface 60 has a BASE PATTERN tab 66 that activates a BASE PATTERN pop-up window 68. The BASE PATTERN pop-up window 68 is automatically activated with the initial user interface 60.

The initial user interface and associated pop-up windows allow a user to set serial data pattern parameters as well as impairment parameters that may be applied to the signal data pattern. The impairment parameters include deterministic jitter impairment and random jitter impairments. The deterministic jitter impairments may include intersymbol interference impairments, duty cycle distortion impairments, sinusoidal jitter impairments, spread spectrum clock impairments, and crosstalk emulation impairments of the present invention. The random jitter impairments may include multiple types of random jitter with each type having a different magnitude and frequency range.

Figure 5:
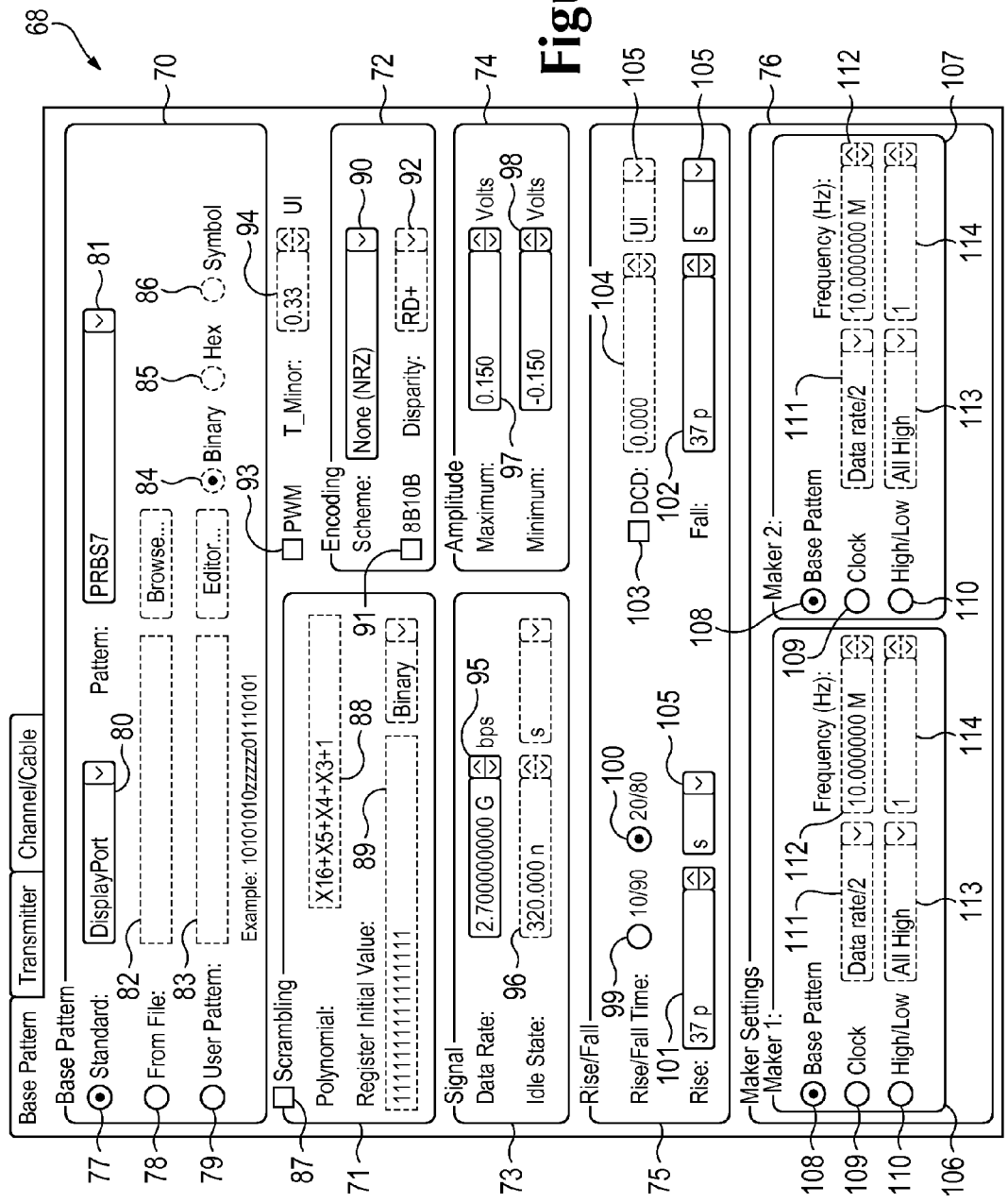
FIG. 5 is a representation of a BASE PATTERN pop-up window for generating a test signal with emulated crosstalk according to the present invention.

FIG. 5 is a more detailed representation of the BASE PATTERN pop-up window 68 showing seven defined regions of the BASE PATTERN pop-up window 68: BASE PATTERN 70, SCRAMMBLING 71, ENCODING 72, SIGNAL 73, AMPLITUDE 74, RISE/FALL 75, and MARKER SETTING 76. The BASE PATTERN region 70 has buttons 77, 78 and 79 that allows a user to select a serial data pattern on which crosstalk emulation is generated. Clicking on the STANDARD button 77 activates a STANDARD box 80 and a PAT- TERN box 81. Click on the STANDARD box 80 allows the user to select from a number of serial data standards requiring compliance testing. Once a particular serial data standard is selected, clicking on the PATTERN box 81 displays various waveform patterns defined by the selected serial data standard, such as PRBS7. Clicking on the FROM FILE button 78 highlights a FILE FIELD box 82 in which a user can enter a previously stored data file. Clicking on the USER PATTERN button 79 highlights a PATTERN FIELD Box 83 in which a user may enter a serial data pattern. The pattern may be entered as "0" and "1" binary data, hexadecimal data or symbol data by clicking on appropriate BINARY, HEX, or SYMBOL buttons 84, 85, 86. The dashed boxes and buttons indicate boxes and buttons that are not active.

Clicking on SCRAMBLING box 87 activates the SCRAMBLING region 71. The SCRAMBLING region 71 has a POLYNOMIAL box 88 in which the user may enter a scrambling polynomial for scrambling the selected serial data pattern. A REGISTER INITIAL VALUE FIELD 89 allows the user to set the initial state of the scrambling register in binary or hexadecimal and the length of the register. The register length is equal to the degrees of the polynomial. The ENCODING region 72 has an ENCODING SCHEME box 90 that allows the user to set the type of coding scheme for the serial data pattern. A user may select from NRZ, NRZI or 4-PAM. Clicking on the 8B10B box 91 activates an algorithm for the mapping of 8-bit symbols to 10-bit symbols to achieve DC-balance and bounded disparity. Clicking on the DISPARITY box 92 allows the user to select a positive or negative initial disparity. Clicking on a PWM (pulse width modulation) box 93 above the ENCODING region 72 activates a pulse width modulated function that allows the user to generate a pulse width modulated signal. The pulse width modulation function has a T_MINOR box 94 in which the user sets the negative state of the bit in the pulse width modulated signal in unit intervals. The SIGNAL region 73 has a DATA RATE box 95 and an IDLE STATE box 96. Clicking on the DATA RATE box 95 allows a user to set the data rate of the serial data. The data rate may be adjusted from 10 Mega Bits per second to 20 Giga bits per second depending on signal generator type. When the STANDARD button 77 is activated, the data rate is automatically selected as a function of the selected serial data standard. The IDLE STATE box 96 is active when SATA is selected in the STANDARD box 80 and Idle Pattern is selected in the PATTERN box 81. The Idle State may be viewed as selectable periods of DC within the pattern.

The AMPLITUDE region 74 has a MAXIMUM AMPLITUDE box 97 and a MINIMUM AMPLITUDE box 98. The MAXIMUM AMPLITUDE box 97 and a MINIMUM AMPLITUDE box 98 allows the user to specify the maximum and minimum amplitude levels of the serial data pattern. The RISE/FALL region 75 has RISE/FALL TIME buttons 99 and 100 for respectively selecting 10/90 or 20/80 percent rise and fall time. A RISE box 101 allows the user to select the rise time of the serial data pattern leading edges. A FALL box 102 allows the user to set the fall time of the serial data pattern trailing edges. Clicking on the DCD box 103, activates the DCD region 104 allowing the user to vary the amount of Duty Cycle Distortion in the serial data pattern. The rise, fall and DCD times may be defined in seconds or unit intervals using the respective SETTING boxes 105.

The MARKER SETTING region 76 has a MARKER 1 section 106 and a MARKER 2 section 107. Each MARKER section 106, 107 has option buttons 108, 109 and 110. Clicking on the one of the BASE PATTERN buttons 108 sets that particular marker output to be the same as the base pattern.

Clicking on one of the CLOCK buttons 109 activates a CLOCK PATTERN box 111 and a FREQUENCY box 112. The CLOCK PATTERN box 111 allows the user to select from a list of clocks or allows the user to define a clock pattern. If the user selects to define the clock pattern, then the user may set the frequency of the clock using the FREQUENCY box 112. Clicking on one of the HIGH/LOW buttons 110 activates a SELECTION box 113 to allow the user to set the marker output to ALL HIGH, ALL LOW or TRIGGER. Selecting the TRIGGER option activates SAMPLE box 114 that allows the user to set the beginning number of samples of the waveform to high.

Clicking on the TRANSMITTER tab 120 activates a TRANSMITTER pop-up window 122 as shown in FIG. 6. The TRANSMITTER pop-up window 122 has three defined regions: PERIODIC JITTER (PK-PK) 124, RANDOM JITTER (RMS) 126 and SSC 128. The PERIODIC JITTER (PK-PK) region 124 allows the user to set parameters for up to four sine wave impairment signals: Sine 1, Sine 2, Sine 3 and Sine 4 that may be applied to the victim signal. Each sine wave impairment signal has a MAGNITUDE box 130 for setting the magnitude of the sine wave impairment signal and associated SETTING box 132 for defining the magnitude in unit intervals or seconds. Each sine wave impairment signal also has a FREQUENCY box 134 and a PHASE box 136 for setting the frequency and phase for impairment signal. The RANDOM JITTER region 126 allows the user to set parameters for generating "crest factor emulation". Clicking on the RJ1 CREST FACTOR (PEAK) box 137 activates a SCALER box 138 where the user can enter a value from 1 to 20 that is multiplied by the magnitude of Rj1 to generate a peak value in unit intervals. Clicking on the RANDOM SEED box 139 activates a RANDON SEED VALUE box 140 allowing the user to assign a maximum five digit seed value for using the same random jitter sequence for each compilation of the digital data pattern with impairments. The RANDON JITTER region allows a user to set parameters for three random jitter impairment signals: Rj1, Rj2 and Rj3 that may be applied to the victim signal. Each random jitter impairment signal has a MAGNITUDE box 140 for setting the magnitude of the random jitter impairment signal and associated SETTING box 141 for defining the magnitude in unit intervals or seconds. Each random jitter impairment signal also has a FREQUENCY-LOW (Hz) box 142 and a FREQUENCY-HIGH (Hz) box 144 for setting low and high frequencies of the random jitter.

Clicking on a SCC box 145 activates the SSC (spread spectrum clock) region 128 allowing the user to set parameters of a spread spectrum clock that may be applied to the victim signal. The user may set the shape, spread and unequal spread for the SSC signal using the SHAPE box 146, the SPREAD box 148 and the UNEQUAL SPREAD box 150. The user may also select a previously stored custom shape clicking on a BROWSE button 151 and entering the file name in a CUSTOM SHAPE box 152. The SSC region 128 includes a df/dt section 153 where the user can insert a deviation in a standard SCC profile. A FREQUENCY section 154 having a DEVIATION box 155 and a MODULATION box 156 allows the user to set frequency parameters of the SSC signal. Clicking on a NOISE box 157 activates a NOISE VALUE box 158 allowing the user to set a noise parameter in VOLTS (RMS) for adding noise to the victim signal. The user has the option of placing the noise at the near end or the far end of the victim signal using ADD NOISE AT box 160. Clicking on a PRE/DE-EMPHASIS box 162 activates a PRE/DE-EMPHASIS parameter box 164 allowing the user to set a pre-emphasis or de-emphasis parameter for the victim signal. The pre-emphasis or de-emphasis parameter may be set in dB or volts using the UNITS box 166. Clicking on the ADVANCED SETUP box 168 activates another pop-up window allowing the user to set additional pre-emphasis and de-emphasis parameters.

Figure 7:
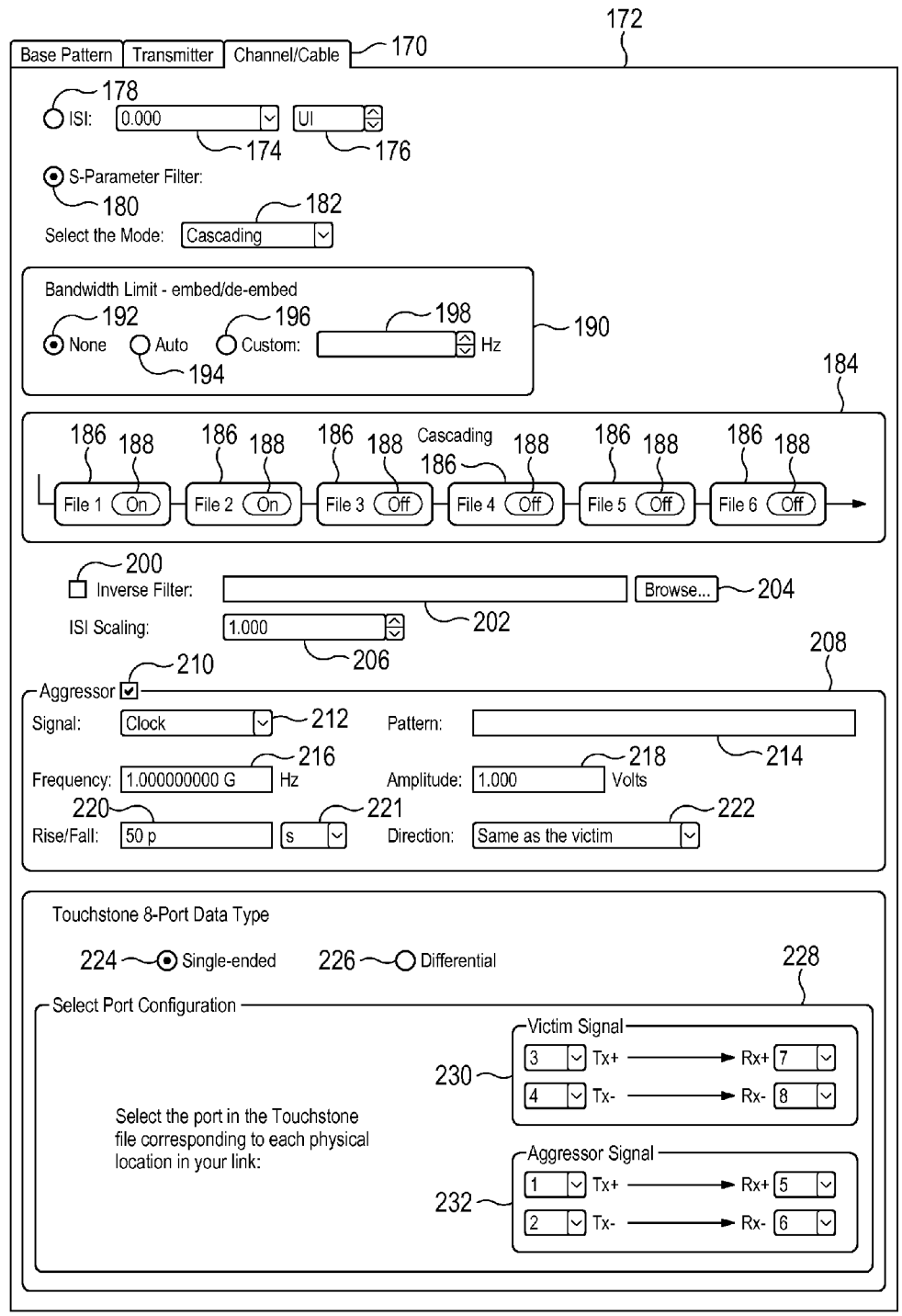
FIG. 7 is a representation of a CHANNEL/CABLE pop-up window for setting parameters for an aggressor signal, a channel and port configuration for generating a test signal with emulated crosstalk according to the present invention.

Clicking on the CHANNEL/CABLE tab 170 activates a CHANNEL/CABLE pop-window 172 as shown in FIG. 7. The user may activate an ISI box 174 and SETTING box 176 by clicking on an ISI button 178. The user can selectively add ISI impairments to a digital data pattern using the ISI box 174 and set the ISI units in seconds or unit interval using the SETTING box 176. The present invention of generating a test signal with crosstalk emulation uses one or more S-parameter filters that are activated by clicking on an S-PARAMETER FILTER button 180. A SELECT A MODE box 182 allows the user to select between a cascading or non-cascading mode. When the non-cascading mode is selected, a browsing area (not shown) appears in place of a FILE CASCADING region 184 to allow the user to browse and select an S-parameter array representing the S-parameters of a signal channel containing a component or components. The S-parameter array may be implemented in a well known S-parameter Touchstone format. The S-parameters of a component may be measured with a vector network analyzer and the resultant data may be saved as an S-parameter array and stored on the storage device 36 of the signal generator 30. A device manufacturer may also provide an S-parameter array of a component or device which may be stored on the storage device 36. When the cascading mode is selected, the FILE CASCADING region 184 appears. The FILE CASCADING region 184 includes a number of FILE boxes 186: FILE 1, FILE 2, FILE 3, FILE 4, FILE 5, and FILE 6. Each FILE box 186 has an icon ON/OFF button 188 that turns each respective FILE box 186 on or off. FIG. 7 shows six FILE boxes 186 but the present invention is not limited to six FILE boxes 186 and more or less FILE boxes 186 may be employed without departing from the scope of the present invention.

The user may click on each of the ON/OFF buttons 188 of the FILE boxes 186 to turn the boxes on. When a FILE box 186 is turned on, a dialog box (not shown) is opened to allow the user to browse and select an S-parameter array for the clicked FILE box. The S-parameter arrays have been previously stored in an S-parameter array library stored on the storage device 36 or stored on a media device, such as a CD, thumb drive or the like, that is loaded into or connected to the signal generator 30. If two or more FILE boxes 186 are turned on in the cascading mode, the user selects an S-parameter array for each active FILE box 186 using the dialog box for that FILE box 186. The S-parameters for a signal channel in the cascading mode are the combination of the S-parameters for the cascaded components representing the total characteristics of the signal channel. A BANDWIDTH LIMIT region 190 allows the user set a bandwidth limit for the signal channel characteristics to be emulated. The user has the option of not limiting the bandwidth by clicking on the NONE button 192, automatically setting the bandwidth limit by clicking on the AUTO button 194, and manually setting the bandwidth limit by clicking on the CUSTOM button 196 and entering a frequency bandwidth limit value in a FREQUENCY box 198.

Below the FILE CASCADING region 184, there is an INVERSE FILTER box 200 and an INVERSE FILTER FILE box 202 and associated BROWSE button 204 that allow the user to select a previously stored S-Parameter array. An ISI SCALING box 206 allows the user to select an ISI scaling factor value for the victim signal which in the preferred embodiment is varied from 0.000 to 10.000 in increments of 0.001.

The user activates the AGRESSOR region 208 by clicking on the AGRESSOR box 210. The AGRESSOR region is used to set the parameters for the aggressor signal. The user sets the type of aggressor signal using the SIGNAL box 212. The user may select a pattern using the PATTERN FIELD box 214. The user sets the frequency of the aggressor signal using the FREQUENCY box 216 and sets the amplitude of the aggressor signal using the AMPLITUDE box 218. The user sets the rise and fall time of the transitions in the aggressor signal using the RISE/FALL box 220. The rise times may be defined in seconds or unit intervals using SETTING boxes 221. The user also sets the direction of the aggressor signal by selecting "Same as the Victim" or "Opposite the Victim" in the DIRECTION box 222.

Figure 8:
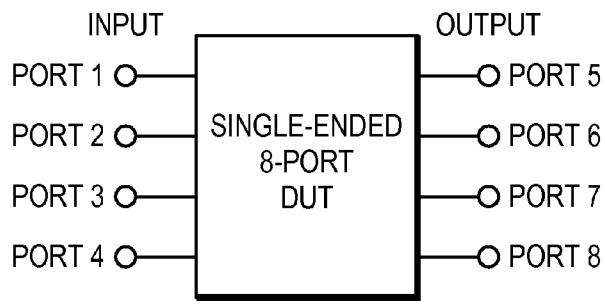
FIG. 8 is a representation of a single-ended 8-port configuration for device under test for generating a test signal with emulated crosstalk according to the present invention.
Figure 9:
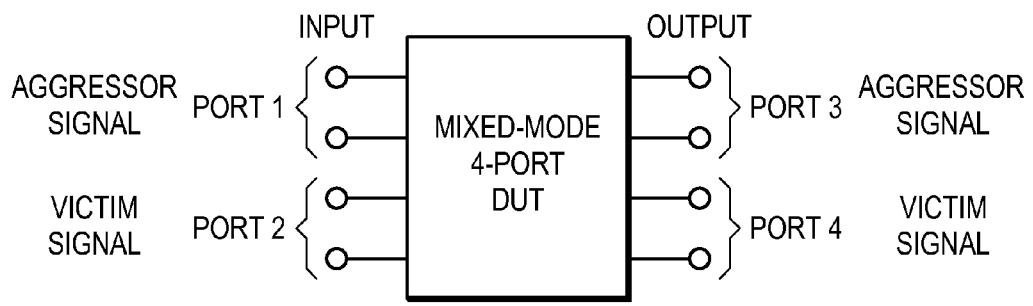
FIG. 9 is a representation of a differential mixed mode 4-port configuration for device under test for generating a test signal with emulated crosstalk according to the present invention.

The S-parameters arrays of the components may be represented as a single-ended or a differential 8-port DUT. The user activates a single-ended or differential S-parameter data type by respectively clicking on either a SINGLE-ENDED button 224 or a DIFFERENTIAL button 226. The S-parameter array of the single-ended type corresponds to standard S-parameters that represent characteristics of a single-ended 8-port circuit of which port number allocation is shown in FIG. 8. The S-parameter array of the differential type corresponds to mixed-mode S-parameters that represent characteristics of a mixed-mode 4-port circuit of which port number allocation is shown in FIG. 9. A SELECT PORT CONFIGURATION region 228 has a VICTIM PORT ALLOCATION area 230 and an AGGRESSOR PORT ALLOCATION 232. The positive side of the differential victim signal is assigned to the ports 3 and 7, and the negative side of the differential signal is assigned to ports 4 and 8. The positive side of the differential aggressor signal is assigned to ports 1 and 5, and the negative side of the differential signal is assigned to ports 2 and 6.

Figure 10:
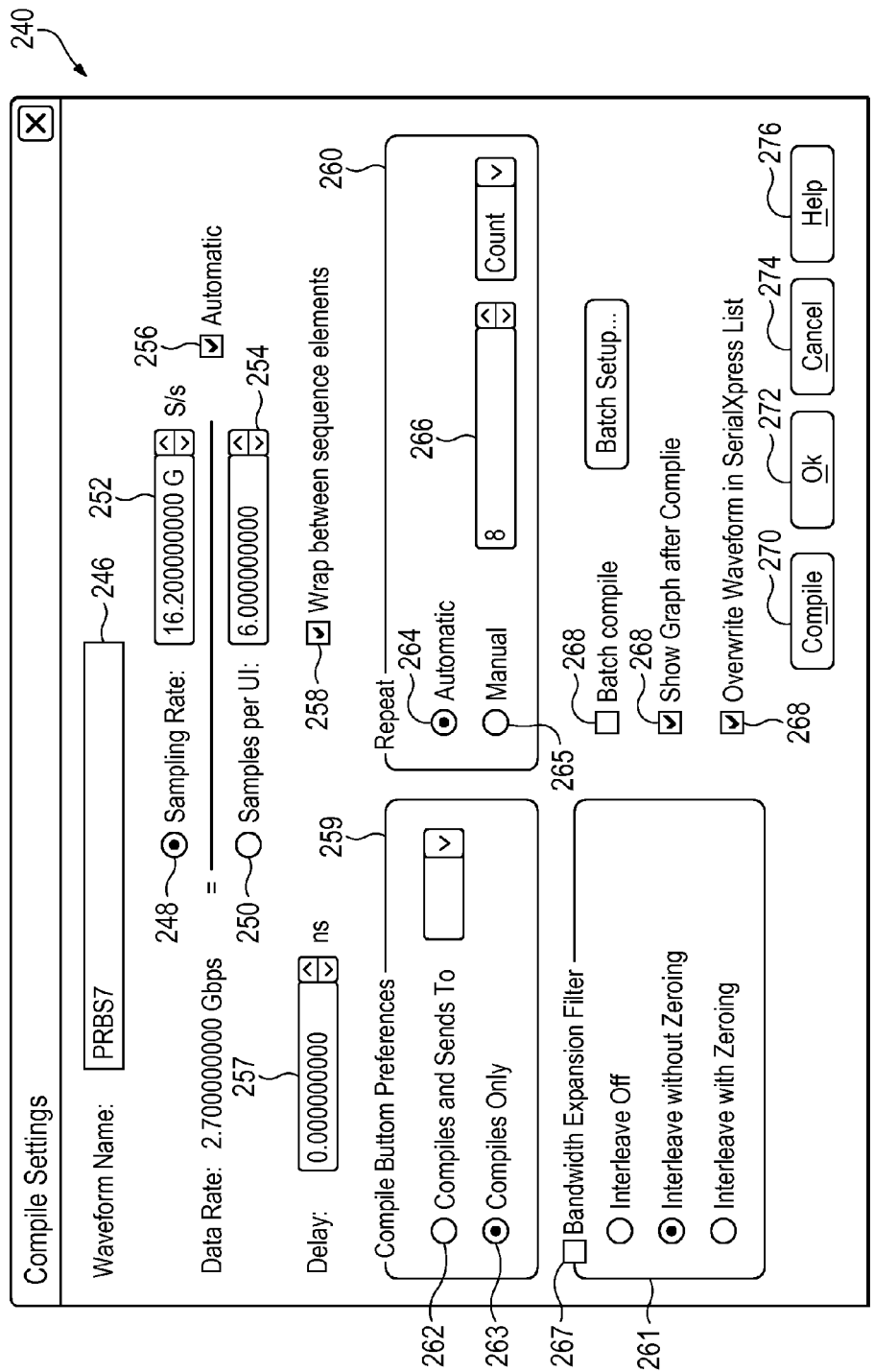
FIG. 10 is a representation of a COMPILE SETTINGS pop-up window for generating a test signal with emulated crosstalk according to the present invention.

Referring back to FIG. 4, once the user has set the parameters for the victim and aggressor signals, the user activates a COMPILE SETTINGS pop-up window 240, shown in FIG. 10, by clicking on a COMPILE SETTINGS button 242 on the initial user interface 60 tool bar 244. The COMPILE SETTINGS pop-up window 240 has a WAVEFORM NAME box 246 that allows a user to define a name for a waveform record file generated by the signal generator 30 using the user defined victim signal having the crosstalk emulation. The data rate for the serial data pattern entered using the BASE PATTERN pop-up window 68 is displayed next to "Data Rate". The user can click on a SAMPLE RATE button 248 or a SAMPLES PER UI button 250 to activate respective SAMPLE RATE or SAMPLES PER UI boxes 252, 254. The user may manually set the sampling rate or samples per UI by entering appropriate values based on the serial data pattern and the data rate. The sampling rate or samples per UI may be automatically set based on the data rate and the serial data pattern by clicking on AUTOMATIC box 256. A DELAY box 257 is provided to help in aligning the start and stop points in waveform sequence elements. The user can set a delay of the next waveform sequence element to allow magnitude alignment of the ending and starting points of the waveform sequence elements. A WRAP BETWEEN SEQUENCE ELEMENTS box 258 may be clicked on to ensures continuity of the waveform when the sequence execution moves from one sequence element to another.

The COMPILE SETTING pop-up window 240 has a COMPILE BUTTON PREFERENCE region 259, a REPEAT region 260 and a BANDWIDTH EXPANSION FILTER region 261. Clicking on the COMPILE AND SEND TO button 262 in the COMPILE BUTTON PREFERENCE region 259 allows the user to select a channel for the compiled waveform record file based on the digital data pattern and impairment parameters. Clicking on the COMPILE ONLY button 263 save the compiled waveform record file in the user named waveform record file. The REPEAT region 260 has an AUTOMATIC button 264 that when activated automatically builds a waveform from repeating pieces based on the Pj, Rj, and SSC frequency values. A MANUAL button 265 allows the user to set the repeat count using a MANUAL COUNT box 266. The repeat count may be set in counts or seconds. Clicking on the BANDWIDTH EXPANSION FILTER box 267 activates the BANDWIDTH EXPANSION FILTER region 261. The signal generator 30 has hardware circuitry that internally provides automatic interleaving of the CH1 and CH2 digital-to-analog converter outputs for high sample rates, such as 12 GS/s and higher. The user may select to leave interleaving off, interleave without zeroing and interleaving with zeroing. On the lower right side of the COMPILE SETTINGS pop-up window 240 are additional parameters that may be set by clicking on the appropriate boxes 268. One of the parameters is SHOW GRAPH AFTER COMPILE which displays the victim signal with emulated crosstalk data in various forms in two graph regions 280 at the bottom of the initial user interface 60. At the bottom of the COMPILE SETTINGS pop-up window 240 are COMPILE, OK, CANCEL and HELP buttons 270, 272, 274 and 276 that allows the user to select various options related to the COMPILE SETTINGS pop-up window 240. One option is to click on the COMPILE button 270 that initiates the compiling of the victim and aggressor signal to generate a waveform record file containing digital data for generating an analog serial victim signal having crosstalk emulation and various other signal impairments from the signal generator 30. Another option is to click on the OK button 272 that saves the parameters selected in the COMPILE SETTINGS pop-up window 240 and closes the window 240. A further option is to click on the CANCEL button 274 that closes the COMPILE SETTINGS pop-up window 240 without saving the parameters selected in the window 240. Clicking on the HELP button 276 activates a HELP pop-up window from which the user may seek help.

The initial user interface 60 tool bar 244 has a COMPILE button 282 (as shown in FIG. 4) that functions in the same manner as the COMPILE button 270 (as shown in FIG. 10) in the COMPILE SETTINGS pop-up window 240 by initiating the compiling of the serial data pattern with the various other parameters to generate a waveform record file containing digital data for generating an analog serial data pattern from the signal generator 30.

Figure 11:
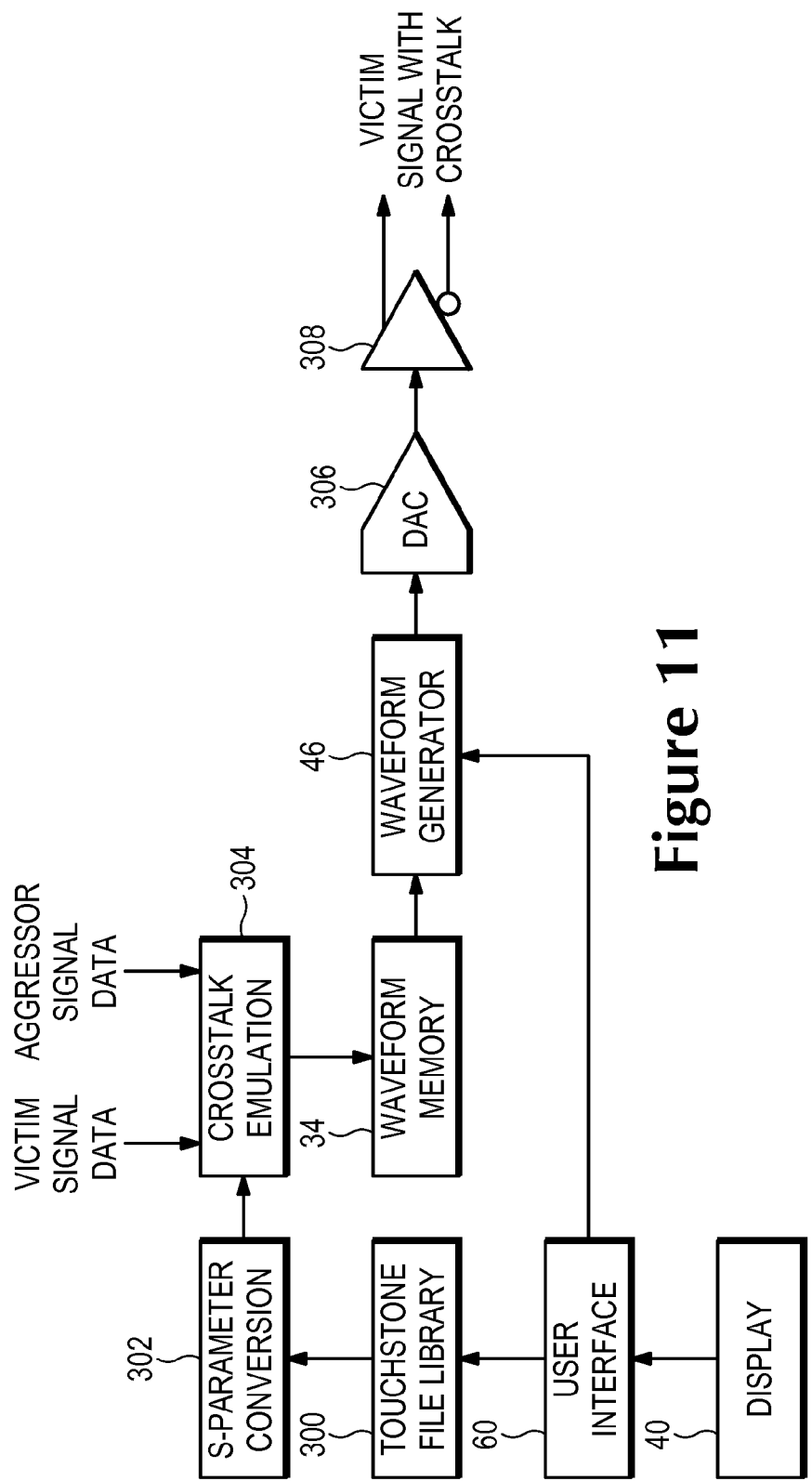
FIG. 11 is a representative block diagram illustrating various hardware and software elements in generating the victim test signal having crosstalk emulation according to the present invention.

Referring to FIG. 11, there is shown a representative block diagram illustrating various hardware and software elements in generating the victim signal having crosstalk emulation. The user inputs parameters for generating the victim and aggressor signals as well as impairments on the signals using the previously described user interface 60 and associated pop-up windows displayed on the display 40. The user selects one or more S-parameter arrays from an S-parameter Array Library 300 for setting S-parameters representing total characteristics of a signal channel using the CHANNEL/CABLE pop-up window 172. An S-parameter conversion block 302 generates a set of S-parameters representing the total characteristics of the cascaded components signal channel if the cascading mode is selected and two or more S-parameter arrays are designated. The S-parameter conversion block 302 also converts single-ended parameters in an S-parameter array(s) to differential mixed-mode S-parameters. Further, coefficients for a series of filters, to be described below, are generated from selected S-parameters of the differential mixed-mode S-parameters. The filters are used for generating a waveform record file representing the victim signal with emulated crosstalk. The filter coefficients are provided to a crosstalk emulation block 304 which uses the filter coefficients for generating a waveform record file representing the victim signal with emulated crosstalk. The waveform record file of the victim signal with crosstalk emulation is stored in a waveform memory that may be a part of memory 34. The waveform record file is read by the waveform generator 46 and processed to generate digital values representing distinct analog voltages of the victim signal with crosstalk emulation. The digital values are converted to analog voltages by digital-to-analog converter, DAC, 306 and coupled to an amplifier 308 that generates an output differential signal of the victim signal with crosstalk emulation.

As is known, S-parameters (scattering parameters) are terms in an S-matrix (scattering matrix) that shows relationship between incident power waves "$a_n$" and reflected power waves "$b_n$" of a n-port (n is a natural number) network. The single-ended or standard S-parameters (Sstd) are described as shown in the following equation 1. The equation 1 shows an example of 8-port single-ended S-parameter network.

$$\begin{bmatrix} b_1 \\ b_2 \\ b_3 \\ b_4 \\ b_5 \\ b_6 \\ b_7 \\ b_8 \end{bmatrix} = \begin{bmatrix} S_{11} & S_{12} & S_{13} & S_{14} & S_{15} & S_{16} & S_{17} & S_{18} \\ S_{21} & S_{22} & S_{23} & S_{24} & S_{25} & S_{26} & S_{27} & S_{28} \\ S_{31} & S_{32} & S_{33} & S_{34} & S_{35} & S_{36} & S_{37} & S_{38} \\ S_{41} & S_{42} & S_{43} & S_{44} & S_{45} & S_{46} & S_{47} & S_{48} \\ S_{51} & S_{52} & S_{53} & S_{54} & S_{55} & S_{56} & S_{57} & S_{58} \\ S_{61} & S_{62} & S_{63} & S_{64} & S_{65} & S_{66} & S_{67} & S_{68} \\ S_{71} & S_{72} & S_{73} & S_{74} & S_{75} & S_{76} & S_{77} & S_{78} \\ S_{81} & S_{82} & S_{83} & S_{84} & S_{85} & S_{86} & S_{87} & S_{88} \end{bmatrix} \cdot \begin{bmatrix} a_1 \\ a_2 \\ a_3 \\ a_4 \\ a_5 \\ a_6 \\ a_7 \\ a_8 \end{bmatrix} \quad \text{EQ 1}$$

The following equation 2 is an example of mixed-mode 4-port S-parameter (Smm) network as shown in FIG. 7.

$$\begin{bmatrix} b_{d1} \\ b_{d2} \\ b_{d3} \\ b_{d4} \\ b_{c1} \\ b_{c2} \\ b_{c3} \\ b_{c4} \end{bmatrix} = \quad \text{EQ 2}$$

$$\begin{bmatrix} S_{dd11} & S_{dd12} & S_{dd13} & S_{dd14} & S_{dc11} & S_{dc12} & S_{dc13} & S_{dc14} \\ S_{dd21} & S_{dd22} & S_{dd23} & S_{dd24} & S_{dc21} & S_{dc22} & S_{dc23} & S_{dc24} \\ S_{dd31} & S_{dd32} & S_{dd33} & S_{dd34} & S_{dc31} & S_{dc32} & S_{dc33} & S_{dc34} \\ S_{dd41} & S_{dd42} & S_{dd43} & S_{dd44} & S_{dc41} & S_{dc42} & S_{dc43} & S_{dc44} \\ S_{cd11} & S_{cd12} & S_{cd13} & S_{cd14} & S_{cc11} & S_{cc12} & S_{cc13} & S_{cc14} \\ S_{cd21} & S_{cd22} & S_{cd23} & S_{cd24} & S_{cc21} & S_{cc22} & S_{cc23} & S_{cc24} \\ S_{cd31} & S_{cd32} & S_{cd33} & S_{cd34} & S_{cc31} & S_{cc32} & S_{cc33} & S_{cc34} \\ S_{cd41} & S_{cd42} & S_{cd43} & S_{cd44} & S_{cc41} & S_{cc42} & S_{cc43} & S_{cc44} \end{bmatrix} \cdot \begin{bmatrix} a_{d1} \\ a_{d2} \\ a_{d3} \\ a_{d4} \\ a_{c1} \\ a_{c2} \\ a_{c3} \\ a_{c4} \end{bmatrix}$$

Mixed-mode 4-port S-parameter (Smm) network may be derived from the single-ended or standard 8-port S-parameter (Sstd) network in the equation 1. To convert the single-ended or standard 8-port S-parameter (Sstd) network to the mixed-mode 4-port S-parameter network (Smm), a transformation matrix M as shown in equation 3 may be used:

$$M = \frac{1}{\sqrt{2}} \begin{bmatrix} 1 & -1 & 0 & 0 & 0 & 0 & 0 & 0 \\ 0 & 0 & 1 & -1 & 0 & 0 & 0 & 0 \\ 0 & 0 & 0 & 0 & 1 & -1 & 0 & 0 \\ 0 & 0 & 0 & 0 & 0 & 0 & 1 & -1 \\ 1 & 1 & 0 & 0 & 0 & 0 & 0 & 0 \\ 0 & 0 & 1 & 1 & 0 & 0 & 0 & 0 \\ 0 & 0 & 0 & 0 & 1 & 1 & 0 & 0 \\ 0 & 0 & 0 & 0 & 0 & 0 & 1 & 1 \end{bmatrix} \qquad \text{EQ 3}$$

wherein there is a relationship of:

$Smm = M \, Sstd \, M^T$ where $M^T$ is the transpose of $M$.     EQ 4

The S-parameters of the resultant differential mixed-mode 4-port S-parameter network use the appropriate transmission parameters between the relevant single ports of the 8-port single-ended S-parameter network.

Referring to FIG. 12, a crosstalk emulation block 304 according to the present invention uses the filter coefficients generated in the S-parameter conversion block 302 for a NEXT (Near End Crosstalk) filter 312, a FEXT (Far End Crosstalk) filter 314 and a forward transmission filter 316. The aggressor signal is separately applied to the FEXT filter 314 and the NEXT filter 312. The filtered output of the NEXT filter 312 is summed with the victim signal using a summing function 318 and applied to the forward transmission filter 316. The filtered output of the forward transmission filter 316 is summed with the filtered aggressor signal from the FEXT filter 314 using a summing routine 320 to generate waveform record data representing the victim signal with emulated crosstalk generated by the aggressor signal. If the aggressor and victim signals are assigned to differential ports as shown in FIG. 9, the NEXT filter 312 is a differential mode S-parameter "$S_{dd21}$" from port 1 to port 2 and the FEXT filter 314 is a differential mode S-parameter "$S_{dd41}$" from port 1 to port 4. The victim signal at the port 2 is affected by the aggressor signal from the port 1 according to the NEXT filter 312 (S-parameter $S_{dd21}$), transferred to port 4 according to a forward transmission filter 316 (S-parameter $S_{dd42}$), and then affected by the aggressor signal from port 1 to port 4 according to the FEXT filter 314 (S-parameter $S_{dd41}$). The crosstalk emulation block 304 emulates the above processes with the aggressor and victim signal data and S-parameter data.

The S-parameters for the 8-port single-ended S-parameter network and the differential mixed-mode 4-port S-parameter network are complex vectors have magnitude and phase. The coefficients of the NEXT filter 312, FEXT filter 314, and forward transmission filter 316 are impulse responses derived from the S-parameter data. Each S-parameter of the mixed-mode 4-Port S-parameter network has magnitude and phase values over a range of frequencies, preferably from DC. The Nyquist limit is determined over the frequency range of the S-parameter and the complex conjugate of the magnitude and phase is determined for the full frequency. An Inverse Fast Fourier Transform, IFFT, or other similar transformation routine to convert frequency data to time domain data, is performed on the complex conjugate data to generate impulse response time domain data. The impulse response time domain data are the coefficients for NEXT filter 312, FEXT filter 314, and forward transmission filter 316. The S-parameter conversion block 302 and the crosstalk emulation block 304 may be implemented using software processes or alternatively, the S-parameter conversion block 302 and the crosstalk emulation block 304 may be implemented as hardware using FPGA, ASIC, etc. or combination of software and hardware.

In the preferred embodiment of the invention, the victim signal with emulated crosstalk is generated during the compile process. During the compile process a victim signal and an aggressor signal are internally generated using the respective victim signal parameters and the aggressor signal parameters. Based on the S-parameters of the signal channel and the aggressor signal port setting, the appropriate S-parameters are extracted and filter coefficients are computed by the S-parameter conversion. With the victim and aggressor signals internally generated and the filter coefficients derived, the waveform record file representing the victim signal with crosstalk emulation is generated and stored in the waveform memory.

The present invention has been described in relation to a DisplayPort communication standard. However, the present invention is limited to this particular communication standard and can equally be used for other communication standards, such as Fiber Channel, PCI-Express and the like. Further, while the present invention has been described using S-parameters representing an 8-port single ended network and a 4-port differential mixed-mode 4-port network, the number of ports for the single ended network is not limited to 8-ports nor are the number of ports for the differential mixed-mode network limited to 4-ports. Other port configuration are possible as long as the number of input ports equals the number of output ports.

It will be obvious to those having skill in the art that many changes may be made to the details of the above-described embodiments of this invention without departing from the underlying principles thereof. The scope of the present invention should, therefore, be determined only by the following claims.

What is claimed is:

1. A signal generating device comprising:
   a display;
   a central processing unit generating a user interface on the display for setting parameters for a victim signal and an aggressor signal wherein a waveform record file of the victim signal is generated using the victim signal parameters and a waveform record file of the aggressor signal is generated using the aggressor signal parameters;
   an S-parameter conversion circuit receiving at least a first S-parameter array representative of characteristics of a multiple-port signal channel and generating filter coefficients for a first filter representing near end crosstalk, a second filter representing far end crosstalk and a third filter representing a transfer characteristic between a first port and a second port;
   a crosstalk emulation circuit receiving the waveform record of the victim signal, the waveform record of the aggressor signal and the filter coefficient for the first, second and third filter and generating a waveform record file representative of the victim signal with emulated crosstalk effects wherein the waveform record file of the aggressor signal is separately filtered by the first filter and the second filter with the filtered waveform record file using the first filter being summed with the waveform record file of the victim signal and the resultant summed waveform record file being filtered by the third filter and summed with the filtered waveform record using the second filter to generate a waveform record file of the victim signal with emulated crosstalk effects; and
   a waveform generation circuit receiving the waveform record file of the victim signal with emulated crosstalk effects and generating an analog output signal representative of the victim signal with emulated crosstalk effects.

2. The signal generator as recited in claim 1 wherein the parameters for the victim signal further comprise deterministic jitter impairments and random jitter impairments.

3. The signal generator as recited in claim 2 wherein the deterministic jitter impairments are selected from a group of parameters for intersymbol interference impairments, duty cycle distortion impairments, sinusoidal jitter impairments and spread spectrum clock impairments.

4. The signal generator as recited in claim 1 wherein the S-parameter array represent a single-ended multiple-port signal channel.

5. The signal generator as recited in claim 1 wherein the S-parameter array represent a differential mixed-mode multiple-port signal channel.

6. The signal generator as recited in claim 5 wherein the differential mixed-mode multiple-port signal channel is modeled having a first differential input port receiving the aggressor signal, a second differential input port receiving the victim signal, a first differential output port receiving the transmitted aggressor signal and a second differential output port receiving the transmitted victim signal with the transmission S-parameter of the S-parameter array from the first input port to the second input port representing characteristics of the first filter, the transmission S-parameter of the S-parameter array from the first input port to the second output port representing characteristics of the second filter, and the transmission S-parameter of the S-parameter array from the second input port to the second output port representing characteristic of the third filter.

7. The signal generator as recited in claim 6 wherein the first filter coefficients, the second filter coefficients, and the third filter coefficients are respective impulse response time domain data respectively derived from the transmission S-parameter of the S-parameter array from the first input port to the second input port representing characteristics of the first filter, the transmission S-parameter of the S-parameter array from the first input port to the second output port representing characteristics of the second filter, and the transmission S-parameter of the S-parameter array from the second input port to the second output port representing characteristic of the third filter.

8. The signal generator as recited in claim 1 wherein the multiple-port device under test further comprises a plurality of components with each component having an S-parameter array characterizing the component.

9. The signal generator as recited in claim 8 wherein the plurality of S-parameter arrays characterizing the plurality of components are combined to generate an S-parameter array characterizing multiple-port signal channel.

10. A method for generating a victim signal having emulated crosstalk comprising steps of:
generating a victim signal waveform record file from victim signal parameters;
generating an aggressor signal waveform record file from aggressor signal parameters;
providing an S-parameter array having an S-parameters representing the characteristics of a multiple-port signal channel;
generating filter coefficients from a first S-parameter of the S-parameter array for a first filter representing near end crosstalk;
generating filter coefficients from a second S-parameter of the S-parameter array for a second filter representing far end crosstalk;
generating filter coefficients from a third S-parameter of the S-parameter array for a third filter representing transfer characteristic between a first port and a second port;
separately filtering the aggressor waveform record file using the respective filter coefficients of the first filter representing near end crosstalk and the second filter representing far end crosstalk;
summing the filtered waveform record file from the first filter with the waveform record file of the victim signal;
filtering the resultant summed waveform record file using the third filter;
summing the filtered waveform record using the third filter with the filtered aggressor waveform record from the second filter to generate a waveform record file of the victim signal with emulated crosstalk effects.

11. The method for generating a victim signal having emulated crosstalk as recited in claim 10 further comprising the step of generating an analog victim signal having emulated crosstalk effects from the waveform record file of the victim signal with emulated crosstalk effects.

12. The method for generating a victim signal having emulated crosstalk as recited in claim 10 wherein the providing S-parameter array having S-parameters representing the characteristics of the multiple-port signal channel further comprises the step of providing a plurality of S-parameter array having S-parameters representing characteristics of a plurality of components of the multiple-port signal channel.

13. The method for generating a victim signal having emulated crosstalk as recited in claim 12 further comprising the step of combining the plurality of S-parameter arrays having S-parameters representing characteristics of the plurality of components of the multiple-port signal channel into an S-parameter array having S-parameters representing the characteristics of the multiple-port signal channel.

14. The method for generating a victim signal having emulated crosstalk as recited in claim 10 wherein the providing an S-parameter array further comprises the step of generating an S-parameter array having S-parameters representing a differential mixed-mode multiple-port signal channel having a first differential input port receiving the aggressor signal, a second differential input port receiving the victim signal, a first differential output port receiving the transmitted aggressor signal and a second differential output port receiving the transmitted victim signal.

15. The method for generating a victim signal having emulated crosstalk as recited in claim 14 wherein the transmission S-parameter of the S-parameter array from the first input port to the second input port represents characteristics of the first filter, the transmission S-parameter of the S-parameter array from the first input port to the second output port represents characteristics of the second filter, and the transmission S-parameter of the S-parameter array from the second input port to the second output port represents characteristic of the third filter.

16. The method for generating a victim signal having emulated crosstalk as recited in claim 15 wherein the generating of the first filter coefficients, the second filter coefficients, and third filter coefficients further comprise the step of generating impulse response time domain data for each of the first, second, and third filters respectively derived from the transmission S-parameter of the S-parameter array from the first input port to the second input port representing characteristics of the first filter, the transmission S-parameter of the S-parameter array from the first input port to the second output port representing characteristics of the second filter, and the transmission S-parameter of the S-parameter array from the second input port to the second output port representing characteristic of the third filter.

* * * * *